United States Patent [19]

Brown et al.

[11] 4,012,767
[45] Mar. 15, 1977

[54] ELECTRICAL INTERCONNECTIONS FOR SEMI-CONDUCTOR DEVICES

[75] Inventors: Dale M. Brown; Marvin Garfinkel, both of Schenectady; Mario Ghezzo, Ballston Lake, all of N.Y.

[73] Assignee: General Electric Company, Schenectady, N.Y.

[22] Filed: Feb. 25, 1976

[21] Appl. No.: 661,092

[52] U.S. Cl. .................................. 357/71; 357/24; 357/65; 357/68; 357/30
[51] Int. Cl.² ................ H01L 23/48; H01L 29/46; H01L 29/54; H01L 29/62
[58] Field of Search ................ 357/24, 30, 65, 68, 357/71; 340/173

[56] References Cited
UNITED STATES PATENTS

| | | | |
|---|---|---|---|
| 3,770,988 | 11/1973 | Engeler et al. | 357/24 |
| 3,795,847 | 3/1974 | Engeler et al. | 357/24 |
| 3,877,049 | 4/1975 | Buckley | 357/71 |
| 3,946,426 | 3/1976 | Sanders | 357/71 |

Primary Examiner—Andrew J. James
Attorney, Agent, or Firm—Julius J. Zaskalicky; Joseph T. Cohen; Jerome C. Squillaro

[57] ABSTRACT

In a semiconductor device low impedance ohmic connection is provided between a first conductor constituted of a metallic oxide material and a second conductor constituted of aluminum by the inclusion between the two conductors of a conductive interface member making low impedance ohmic contact to each of the first and second conductors.

12 Claims, 7 Drawing Figures

ELECTRICAL INTERCONNECTIONS FOR SEMI-CONDUCTOR DEVICES

The present invention relates in general to electrical interconnection systems for semiconductor devices and in particular to electrical interconnection systems utilizing different conductive materials.

Imagers are an example of one kind of semiconductor device using different conductive materials. Imagers include an array of radiation sensing devices and also scanning and signal processing circuits for operating the array. Typically silicon is the semiconductor material used in such imagers. The choice of conductive materials used in the array portion of the imager is governed by criteria such as good transmission of incident radiation and broad spectral response, in addition to good electrical conductivity. A conductive material meeting such criteria is indium tin oxide. The choice of metallic materials used in the scanning and signal processing circuit portion of the imager for interconnection of the electrodes of the devices thereof is governed by criteria such as good ohmic contact to electrodes of the devices and the substrate, high conductivity, good mechanical bonding to the insulation layers of the imager, and ease of application. A conductive material meeting these criteria is aluminum. When a direct bond is made between conductors of indium tin oxide and conductors of aluminum in the final metallization step used for forming the interconnections in the circuit portion of the imager, high impedance interconnections result. It appears that in the process of sintering the aluminum conductors to provide good bonding to the silicon material used in the imager, the aluminum reduces the indium tin oxide with the result that a high impedance interface layer of aluminum oxide is formed between the indium tin oxide conductors and the corresponding aluminum conductors.

An object of the present invention is to provide good and reliable ohmic contacts to conductors constituted of metallic oxide materials.

Another object of the present invention is to provide good and reliable ohmic contacts between conductors constituted of indium tin oxide and conductors constituted of aluminum.

A further object of the present invention is to provide good and reliable ohmic contacts between the conductors constituted of antimony tin oxide and conductors constituted of aluminum.

In carrying out the present invention in an illustrative embodiment thereof there is provided a substrate of semiconductor material having a major surface. A first layer of insulating material overlies the major surface of the substrate. A first conductive member of a light transmissive metallic oxide material overlies the first layer of insulating material. A second layer of insulating material overlies the first conductive member and has an opening therein. A second conductive member of aluminum is located on the second layer of insulating material. A third conductive member is located in the opening. One portion of the third conductive member makes low impedance ohmic contact to the first conductive member and another portion thereof makes low impedance ohmic contact to the second conductive member. The third conductive member is constituted of a material relatively inactive chemically with respect to the metallic oxide material and aluminum.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Figure 1:
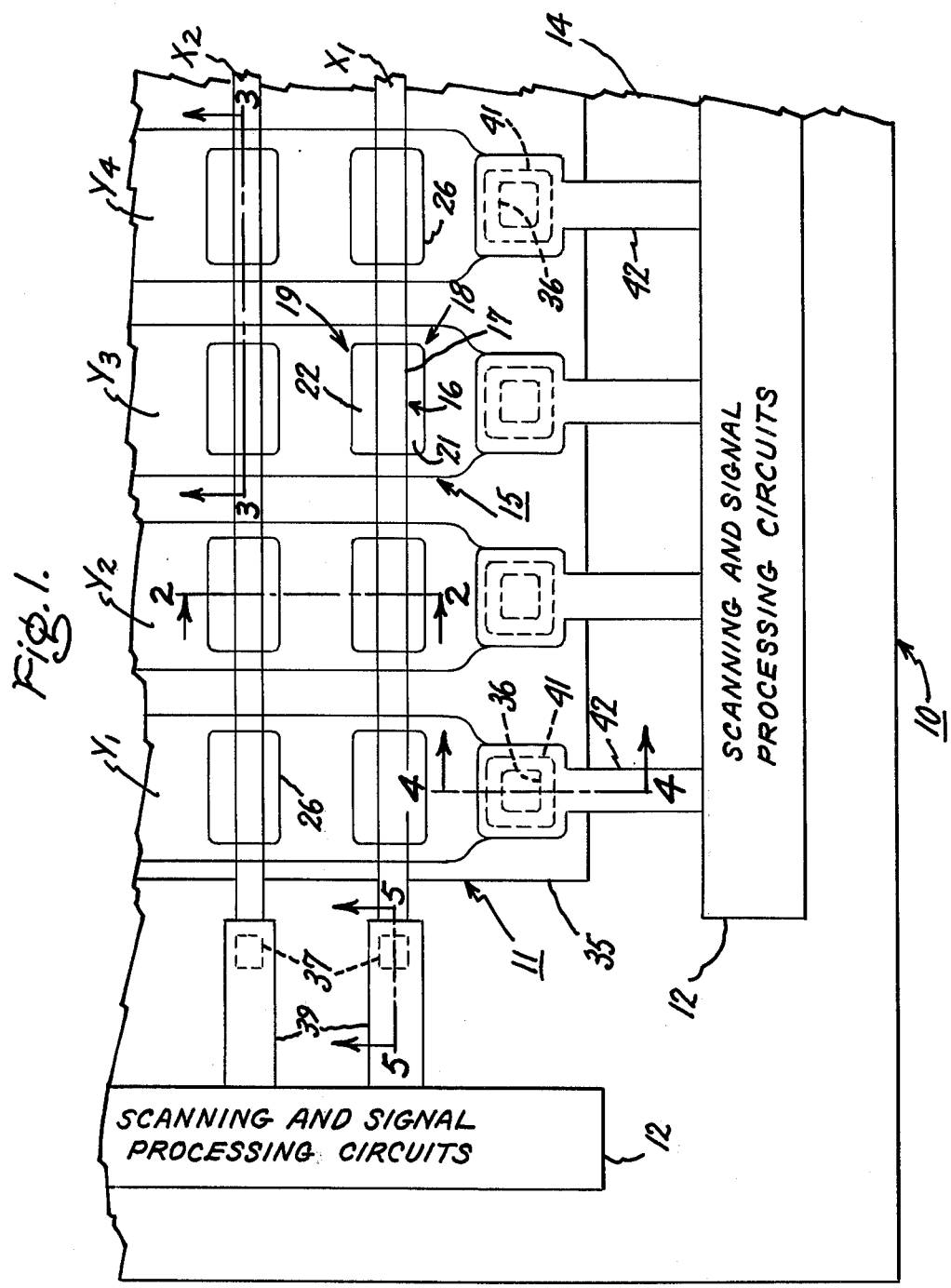
FIG. 1 is a plan view of an imager including an array of radiation responsive devices and scanning and sensing circuits therefor embodying the present invention.
Figure 2:
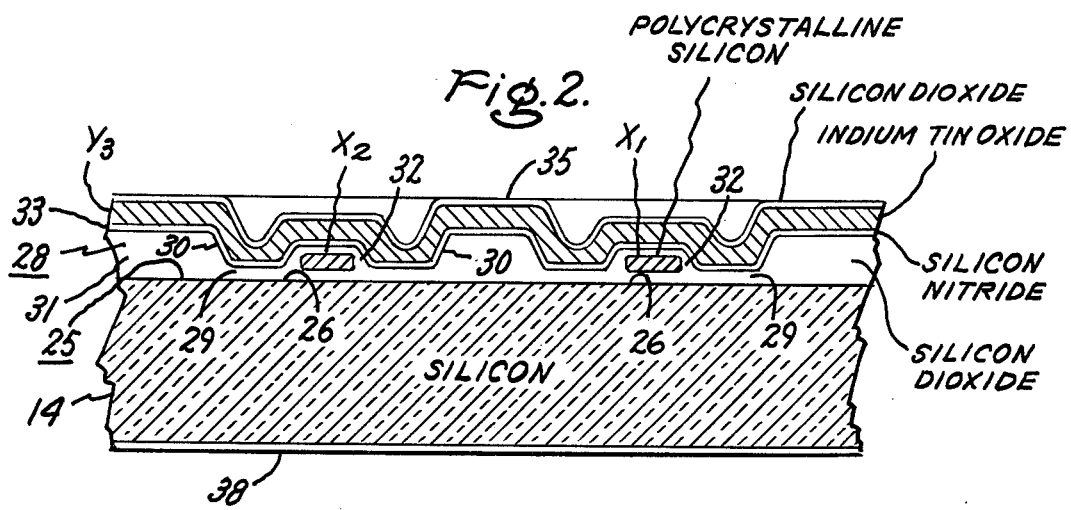
FIG. 2 is a sectional view of the imager of FIG. 1 taken along section lines 2—2 of FIG. 1.
Figure 3:
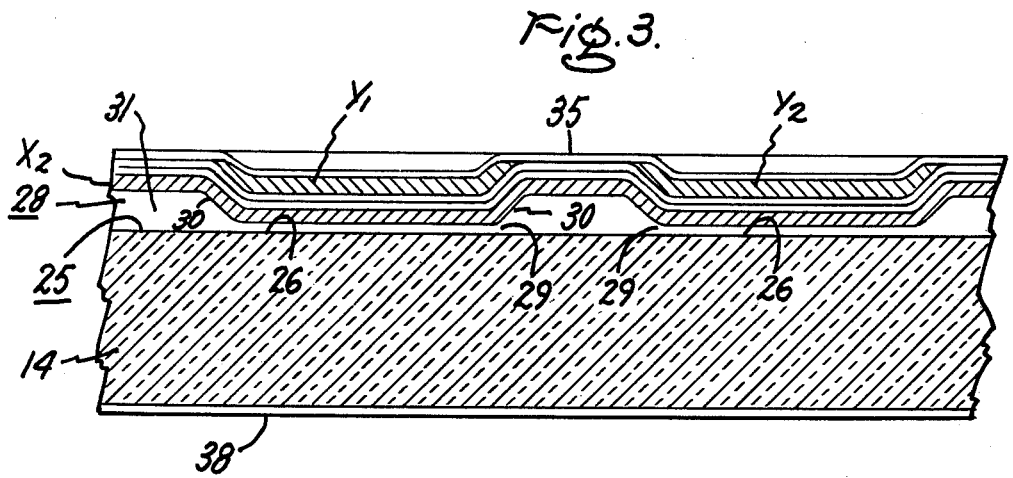
FIG. 3 is a sectional view of the imager of FIG. 1 taken along section lines 3—3 of FIG. 1.

Reference is now made to FIGS. 1–5 which show the present invention as embodied in an imager 10 which includes an image sensing array 11 of radiation sensing devices and circuits 12 for operating the array located on a common substrate 14. The array 11 is in general similar to the array described and claimed in patent application Ser. No. 573,842, filed May 2, 1975, and assigned to the assignee of the present invention. Each device 15 of the array 11 includes a first or row CIS (Conductor-Insulator-Semiconductor) charge storage capacitor 16 of generally rectangular outline in which the plate or conductor 17 thereof is connected to and integral with the row conductor line or strip of the row in which the device is located and a pair of column CIS charge storage capacitors 18 and 19, collectively designated as a second storage capacitor, each adjacent a respective side of the row CIS charge storage capacitor 16 in which the plates or conductors 21 and 22 thereof are connected to and are integral with the column conductor line or strip of the column in which the device is located. The radiation sensing devices 15 are arranged in two rows and four columns. The array includes two row conductor lines or strips designated $X_1$ and $X_2$ from bottom to top. The electrode portions of each row line constitute the row plates of a respective row of devices. The array also includes four column conductor lines or strips orthogonally oriented with respect to the row conductor lines designated $Y_1$–$Y_4$ from left to right. The electrode portions of each column line constitute the column plates of a respective column of devices. The row lines are constituted of a moderately light transmissive conductive material, such a doped polycrystalline silicon. The column lines are constituted of another light transmissive conductive material, such as indium oxide doped with tin oxide, referred to as indium tin oxide. Indium tin oxide and the film deposition thereof is described in RCA Review Vol. 32, June 1971, on page 299 in an article entitled "RF Sputtered Transparent Conductors-The System $In_2O_3$—$SnO_2$" by John L. Vossen and also in Journal of Electrochemical Society, October 1972, on page 1368 in an article entitled "Highly Conductive, Transparent Films of Sputtered $In_{2-x}Sn_xO_{3-y}$" by D. B. Fraser and H.

D. Cook. Indium tin oxide is a desirable material for the column lines. It transmits a large percentage (about 80% for layers about 0.5 micron thick) of the visible light penetrating its surface. It can be made to provide relatively high conductivity. It is a semiconductor with a wide band gap and hence its band pass characteristic holds up over the blue end of the visible spectrum.

The array is formed on a substrate or wafer 14 of semiconductor material having a major surface 25 in which are provided a plurality of surface regions 26. The surface regions 26 are arranged into a plurality of rows and columns. The surface regions 26 are of substantially identical area and outline. As shown, the surface regions 26 are of generally rectangular outline with the long sides parallel to the row direction and the short sides parallel to the column direction. A thick layer 28 of light transmissive insulating material overlies the major surface and has a plurality of thin portions 29, each in registry with a repective one of the surface regions 26. The thin portions are provided by forming deep recesses 30 in the thick insulating layer 28. Thus, the insulating layer 28 includes thick or ridge portions 31 surrounding a plurality of thin portions 29 in the bottoms of the recesses 30. A plurality of row conductor lines $X_1$ and $X_2$ each of the same and uniform width are provided overlying the layer of insulation 28. Each row conductor line is in traversing relationship to the surface regions 26 of a respective row of surface regions and overlying fixed first portions of the surface region of the respective row. The portions of the row conductor lines overlying the surface regions 26 constitute the conductors or electrodes of a plurality of first conductor-insulator-semiconductor capacitors formed with the thin portions 29 of the insulating layer and the substrate 14. A plurality of column conductor lines $Y_1-Y_4$ each of the same and uniform width are provided insulatingly overlying the row conductor lines. Each column conductor line is in traversing relationship to the surface regions 26 of a respective column of surface regions and overlying entirely the surface regions of the respective column. The portions of the column conductor lines overlying the surface regions 26 not shielded or masked by the row conductor lines constitute the conductors 21 and 22 of a plurality of second conductor-insulator-semiconductor capacitors formed with the thin portions 29 of the insulating layer and the substrate. Each second conductor-insulator-semiconductor capacitor includes a pair of capacitors 18 and 19 both of which are coupled to a respective first conductor-insulator-semiconductor capacitor 16.

The imaging sensing array 11 and the devices 15 of which they are comprised may be fabricated using a variety of materials and in a variety of sizes in accordance with established techniques for fabricating integrated circuits. One example of an array using specific materials and specific dimensions will be described. The semiconductor starting material is a wafer of monocrystalline silicon of N-type conductivity of about 4 ohm-cm resistivity and having a major surface along the 111 crystallographic plane thereof and conveniently 10 mils thick. The insulating layer 28 comprises thermally grown silicon dioxide with the thin portions thereof having a depth of approximately 0.1 micron. The thin portions 29 are separately grown after etching of an initially uniform thick layer of about 1.5 microns of the thermally grown silicon dioxide to form openings therein and to define the surface storage regions 26 in the major face 25 of the substrate. The row lines $X_1$ and $X_2$ and the conductors of the first CIS capacitors thereof are formed of doped polycrystalline silicon. The column lines $Y_1-Y_4$ and the split conductors or electrodes 21 and 22 of the second CIS capacitors are constituted of sputtered indium tin oxide, sputtered from a source consisting of approximately 10% of tin oxide and 90% of indium oxide by weight to a thickness of about 0.5 micron. The dimensions of the active surface regions 26 of each of the devices are approximately 1.3 mils by 0.9 mil. The centers of the active regions are spaced in the horizontal or row direction approximately 1.7 mils apart and the centers of the active regions in the vertical or column direction are spaced approximately 1.3 mils apart. An insulating layer 32 of silicon dioxide of approximately 0.1 micron surrounds the row strip 32 or lines $X_1$ and $X_2$ of polycrystalline silicon. A layer about 0.1 micron of silicon nitride 33 is provided between the column line strips $Y_1-Y_4$ and the row line stripes $X_1$ and $X_2$.

In the fabrication of the array a thick layer of field oxide approximately 1.5 microns thick is thermally grown on a major surface of the N-type silicon wafer of 4 ohm-cm resistivity. Openings extending to the major surface of the silicon wafer are formed in the oxide layer exposing the active surface regions 26 in the major surface using conventional photolithographic techniques and thereafter thin portions 29 of silicon oxide approximately 0.1 micron thick are thermally grown over the active surface regions 26. A layer of polycrystalline silicon is vapor deposited by decomposition of silane to a thickness of approximately 0.5 micron. Thereafter, the polycrystalline silicon is doped highly conductive N-type using phosphorous oxychloride vapor. The polycrystalline silicon layer is then patterned into the strips which form the row conductors or electrodes of the devices 15 as well as the row conductor lines $X_1$ and $X_2$ thereof. After removal of the patterning oxide from the polycrystalline silicon strips thermal oxide is grown on polycrystalline lines to a thickness of approximately 0.1 micron.

In order to protect the active surface regions of the substrate as well as the thermally grown oxide overlying the active surface regions from environmental contamination and also to assure good electrical isolation of the row and column lines, a layer of silicon nitride 33 approximately 0.1 micron thick is chemically vapor deposited using silane and ammonia in a hydrogen atmosphere. The silicon nitride layer 33 is suitably patterned to cover both the area of the array in which the devices 15 are located and the portion of the imager in which are located the scanning and signal processing circuits. After opening contact holes in the insulation including the layer of silicon nitride in the scanning and signal processing circuits portion of the imager for the purpose of making contacts to the elements thereof, a layer of indium tin oxide approximately 0.5 micron thick is formed on the array by sputtering. To this end the wafer is placed in conventional r-f sputtering apparatus in which the target electrode is a ceramic disc of approximately 90% indium oxide and 10% tin oxide by weight. After deposition the indium tin oxide layer is annealed to improve the conductivity thereof. The layer of indium tin oxide is then patterned into the column strips using photolithographic masking and etching techniques. A suitable technique for patterning the indium tin oxide layer is described in U.S. Pat. No. 3,979,240 assigned to the assignee of the present invention. A layer 35 of silicon dioxide approximately 0.4 micron thick is then formed over the indium tin oxide strips by chemical vapor deposition using silane and oxygen. The silicon dioxide layer 35 is suitably patterned to cover the radiation sensing device area of the array. The layer 35 provides protection for indium tin oxide layers in connection with further processing of the array, for example, in connection with the processing of circuits for operating the array and located on the same substrate.

Concurrently with the formation of the array of radiation sensing devices 15 the various active and passive devices of the scanning and signal processing circuits 12 of the imager are formed on the substrate. For a number of reasons, aluminum is a highly desirable material to provide not only the innerconnections between the various active and passive devices of the operating circuits but also between the various conductive lines of the array, and the operating circuits. Aluminum is easily applied and formed into the various electrical innerconnections required. Aluminum readily bonds to P-type and N-type silicon semiconductor material at relatively low sintering temperatures to form low impedance ohmic contacts therewith. Aluminum readily adheres to the various insulating materials used, such as silicon dioxide, silicon nitride and mixtures thereof. However, innerconnection of lines of aluminum to lines of indium tin oxide presents a problem. During the final stages of fabrication of the imager, openings 36 are etched in the insulation layer 35 covering the indium tin oxide strips and also in the insulation layer covering the various active and passive devices of the operating circuits. The aluminum is deposited over the assembly includng the openings and then etched to form the desired interconnections. Thereafter, aluminum is sintered at a relatively low temperature to form the conducting contacts to the various conductive elements of the imager as well as to form good adhesive bonds to the various insulating layers of the imager. We find that although aluminum makes low impedance ohmic contact to both N and P doped silicon, the electrical contact between the aluminum and the indium tin oxide is of very high impedance. It is our presumption that during the sintering of the aluminum to form the aforementioned contacts, the aluminum reduces the indium tin oxide and forms a high impedance layer of aluminum oxide at the interface between the indium tin oxide and the aluminum.

Figure 4:
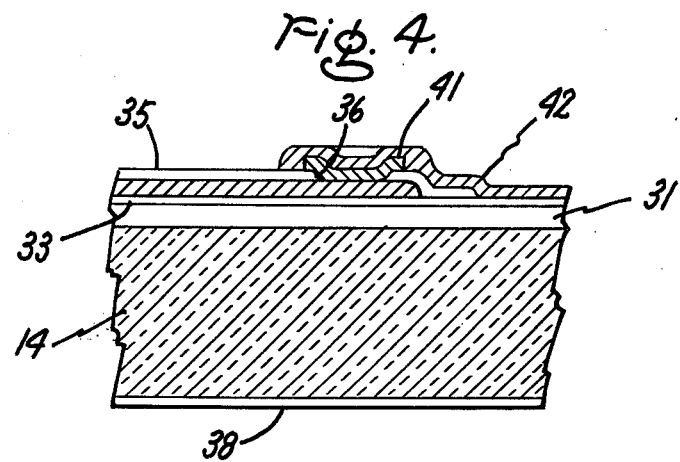
FIG. 4 is a sectional view of the imager of FIG. 1 taken along section lines 4—4 of FIG. 1.

In accordance with the present invention, in order to form low impedance contacts between the strips of indium tin oxide and the aluminum lines, conductive members 41 are provided in the openings 36 overlying the indium tin oxide strips to separte the indium tin oxide strips from the deposited aluminum as shown particularly in FIG. 4. The conductive members 41 formed in the openings 35 may be constituted of a number of materials, such as the refractory metals, which are relatively inactive chemically with the indium tin oxide and which provide good conductive connection thereto and to the aluminum lines. Molybdenum is a particularly suitable material. Prior to the final metallization step in which aluminum is applied, a layer of molybdenum is deposited over the imager assembly including the openings 35 overlying the indium tin oxide strips and then etched to form conductive members 41 of molybdenum in the openings 36. Thereafter, a layer of aluminum is deposited over the entire assembly including the molybdenum members 41 and etched to form the conductive innerconnections between the indium tin oxide strips of the array and the various aluminum lines 42 of the imager. On sintering of the aluminum lines 42 to provide good electrical and mechanical bonds to the assembly, the molybdenum members serve to isolate the indium tin oxide strips $Y_1$–$Y_4$ from the reducing action of the aluminum lines. Thus, good electrical contact is assured between the indium tin oxide lines $Y_1$–$Y_4$ and the various aluminum lines 42 of the imager.

While the other chemically non-active conductive metallic materials may be used in place of molybdenum for the conductive member 41 such as tungsten, a particular advantage in the use of molybdenum is that the same etch may be used to etch aluminum as well. An etch suitable for this purpose consists of phosphoric acid, water, acetic acid, and nitric acid in the relative proportions of 380:75:30:15, respectively. The etch would be used with Waycoat negative photoresist.

Figure 6:
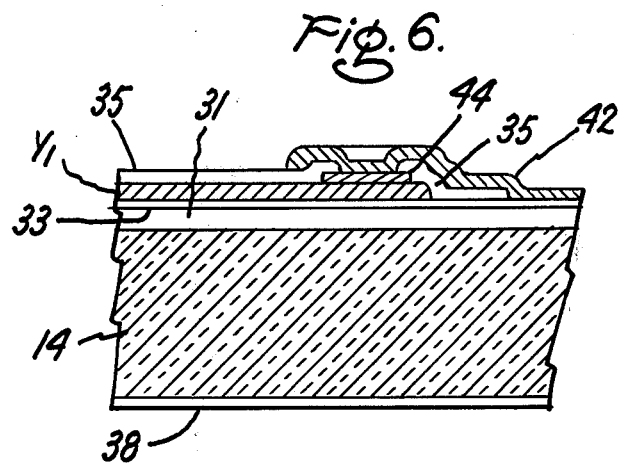
FIG. 6 is a sectional view similar to the sectional view of FIG. 4 illustrating another embodiment of the present invention.

The molybdenum members 41 may be applied to the indium tin oxide strips prior to the formation of the protective silicon dioxide layer thereon as shown in FIG. 6. In this case, the molybdenum layer would be applied over the layer of indium tin oxide and etched to form the various conductive members 44 thereon. Thereafter, the layer of indium tin oxide is etched to form the individual lines $Y_1$–$Y_4$ therefrom. The aforementioned molybdenum etch would be used for etching the molybdenum layer as it does not attack indium tin oxide. Etchants such as concentrated hydrobromic acid described in patent application Ser. No. 573,843 mentioned above would be suitable for etching the indium tin oxide.

While the aluminum lines 42 are shown overlying the openings 36 in which the conductive members are contained, it is apparent that the aluminum lines may terminate at points remote from the openings 36. Conductive contact would be made to aluminum lines 42 by extending the conductive members 41 on the insulation 31 to provide connections at the remote points.

Figure 7:
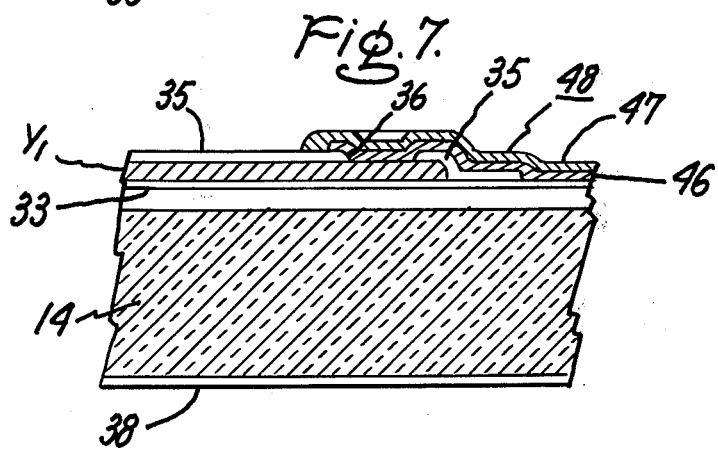
FIG. 7 is a sectional view similar to the sectional view of FIG. 4 illustrating still another embodiment of the present invention.

Non-stoichiometric titanium dioxide, which is conductive, as distinguished from stoichiometric titanium dioxide which is an insulator, may be used to provide conductive connection between indium tin oxide and aluminum as shown in FIG. 7. To this end, prior to the aluminum metallization step, a titanium layer 46 would be deposited over the protective oxide layer 35 on the assembly and into the openings 36 overlying the indium tin oxide strips, and the titanium layer 46 would also be deposited over the insulation layer with openings in the operating circuit portion of the imager. Thereafter, a layer 47 of aluminum would be deposited over the titanium. The composite aluminum-titanium layer 48 would then be etched using a suitable aluminum etch such as mentioned above and a suitable titanium etch such as dilute fluoroboric acid to form the various innerconnections of the imager. The aluminum-titanium interconnections 48 would be sintered at a relatively low temperature about 500° C for a short time to form a good conductive bond of the aluminum-titanium innerconnections to the various elements of the operating circuit portion of the imager and to the various strips of the array. Titanium also adheres well to the insulating surface on which it is deposited. The sintering of the titanium contacting the indium tin oxide lines reduces the indium tin oxide and forms non-stoichiometric titanium dioxide at the interface between the two conductors. To assure formation of non-stoichiometric titanium dioxide, excess titanium would be deposited with regard to the sintering parameters used. As non-stoichiometric titanium oxide is a relatively good conductor, a low impedance ohmic contact is thus provided between indium tin oxide lines and the aluminum-titanium lines.

In connection with the processing of the interconnection structure of FIG. 7, if desired, the titanium may be patterned to limit it to the vicinity of the openings. As a result of such patterning, a structure similar to the structure of FIG. 4 is obtained with the conductive member 41 now comprising titanium and non-stoichiometric titanium dioxide.

Figure 5:
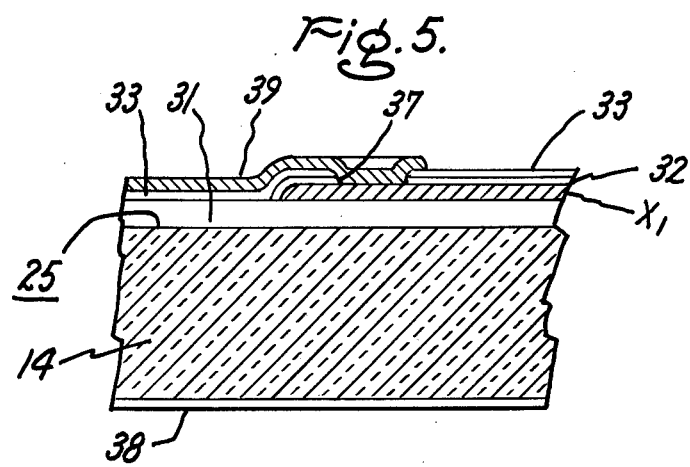
FIG. 5 is a sectional view of the imager of FIG. 1 taken along section lines 5—5 of FIG. 1.

The manner of forming the connection of the polycrystalline silicon row lines $X_1$ and $X_2$ to the operating circuit 15 of the array is illustrated in FIG. 5. Prior to aluminum metallization step for fabricating the imager, openings 37 are etched in the thick insulation 31 where contacts are desired to the polycrystalline silicon lines $X_1$ and $X_2$. In the aluminum metallization step, aluminum is evaporated over the entire assembly including the openings to a suitable thickness and patterned into conductive lines 39. In the aluminum sintering step the aluminum lines are bonded to the polycrystalline silicon lines $X_1$ and $X_2$ and form good low impedance connections therewith.

A conductive electrode 38 of a suitable material such as aluminum is also applied to the other major face of the substrate to provide an ohmic connection thereto.

While the invention has been described and illustrated in connection with conductors constituted of indium tin oxide, it is apparent that the invention is equally applicable to semiconductor devices utilizing other metallic oxide conductors such as antimony tin oxide. A composition of antimony tin oxide suitable for use in the imager structure described above would be 5% $Sb_2O_3$ and 95% $SnO_2$ by weight.

While the invention has been described in connection with imagers, it is apparent that the invention is equally applicable to such devices as solar cells and light emitting devices utilizing conductive members of light transmissive metallic oxide materials. In such applications the light transmissive metallic oxide material would be in direct contact with the semiconductor substrate forming either a rectifying or non-rectifying contact therewith.

While the invention has been described in specific embodiments, it will be appreciated that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. In combination,
   a substrate a semiconductor material having a major face,
   a first conductive member of a light transmissive metallic oxide material overlying said substrate,
   a second conductive member of aluminum,
   a third conductive member in low impedance ohmic contact with said first and second conductive members.

2. The combination of claim 1 including first layer of insulating material interposed between said major surface of said substrate and said first conductive member.

3. The combination of claim 2 including a second layer of insulating material lying on said first conductive member and having an opening therein exposing a portion of said first conductive member, said second conductive member of aluminum located on said layer of insulating material, said third conductive member having one portion lying in said opening and contacting said first conductive member and having another portion contacting said second conductive member.

4. The combination of claim 2 in which said first conductive member forms a capacitor with said substrate and said first layer of insulation.

5. The combination of claim 4 in which said light transmissive material is selected from the class of indium tin oxide and antimony tin oxide and combinations thereof.

6. The combination of claim 4 in which said light transmissive material consists of approximately 90% by weight of indium oxide and the remainder tin oxide.

7. The combination of claim 4 in which said light transmissive material consists of approximately 5% by weight of antimony oxide and the remainder tin oxide.

8. The combination of claim 1 in which said third conductive member comprises a refractory metal.

9. The combination of claim 8 in which said refractory metal comprises molybdenum.

10. The combination of claim 1 in which said third conductive member comprises titanium.

11. The combination of claim 1 in which said third conductive member comprises non-stoichiometric titanium oxide.

12. The combination of claim 1 in which said semiconductor material comprises silicon.

* * * * *